(12) United States Patent
Eastlack (10) Patent No.: US 9,071,077 B2
(45) Date of Patent: *Jun. 30, 2015

(54) LIMITATION OF VAMPIRIC ENERGY LOSS WITHIN AN INDUCTIVE BATTERY CHARGER OR EXTERNAL POWER SUPPLY USING MAGNETIC TARGET DETECTION CIRCUITRY

(71) Applicant: Jeffrey R. Eastlack, Austin, TX (US)

(72) Inventor: Jeffrey R. Eastlack, Austin, TX (US)

( * ) Notice: Subject to any disclaimer, the term of this patent is extended or adjusted under 35 U.S.C. 154(b) by 307 days.

This patent is subject to a terminal disclaimer.

(21) Appl. No.: 13/746,332

(22) Filed: Jan. 22, 2013

(65) Prior Publication Data

US 2013/0187597 A1   Jul. 25, 2013

Related U.S. Application Data

(60) Provisional application No. 61/590,061, filed on Jan. 24, 2012.

(51) Int. Cl.
*H02J 7/00*   (2006.01)
*H02J 7/02*   (2006.01)
*H05K 13/00*   (2006.01)
*H02J 5/00*   (2006.01)

(52) U.S. Cl.
CPC ............ *H02J 7/025* (2013.01); *H05K 13/0023* (2013.01); *Y10T 29/49117* (2015.01); *H02J 5/005* (2013.01)

(58) Field of Classification Search
CPC .................................. H02J 5/005; H02J 7/025
USPC .................. 320/107–109, 134–140, 152, 157
See application file for complete search history.

(56) References Cited

U.S. PATENT DOCUMENTS

| | | | |
|---|---|---|---|
| 2010/0001684 A1 | 1/2010 | Eastlack | |
| 2010/0001685 A1 | 1/2010 | Eastlack | |
| 2010/0225273 A1 | 9/2010 | Eastlack | |
| 2011/0050170 A1 | 3/2011 | Eastlack | |
| 2013/0093381 A1* | 4/2013 | McGinley et al. | 320/107 |

* cited by examiner

*Primary Examiner* — Paul Dinh
(74) *Attorney, Agent, or Firm* — Andrew Alia, Esq.

(57) ABSTRACT

Vampire energy loss occurs when an electronic or mechanical machine consumes energy while not being utilized for any useful purpose. Vampire energy losses in consumer electronic devices are under intense scrutiny for needlessly wasting an estimated 20% of the electric power production in the United States. It is also estimated by the US Department of Energy that by 2015 vampire electronics could be responsible for nearly 30 percent of the total household power consumption in the United States. Smarter vampire proof technologies are needed to address this growing problem.

20 Claims, 11 Drawing Sheets

LIMITATION OF VAMPIRIC ENERGY LOSS WITHIN AN INDUCTIVE BATTERY CHARGER OR EXTERNAL POWER SUPPLY USING MAGNETIC TARGET DETECTION CIRCUITRY

CROSS REFERENCE TO RELATED APPLICATION

This application claims the benefit of U.S. Provisional Application No. 61/590,061, filed on Jan. 24, 2012, which is hereby incorporated by reference in its entirety.

BACKGROUND

Figure 1:
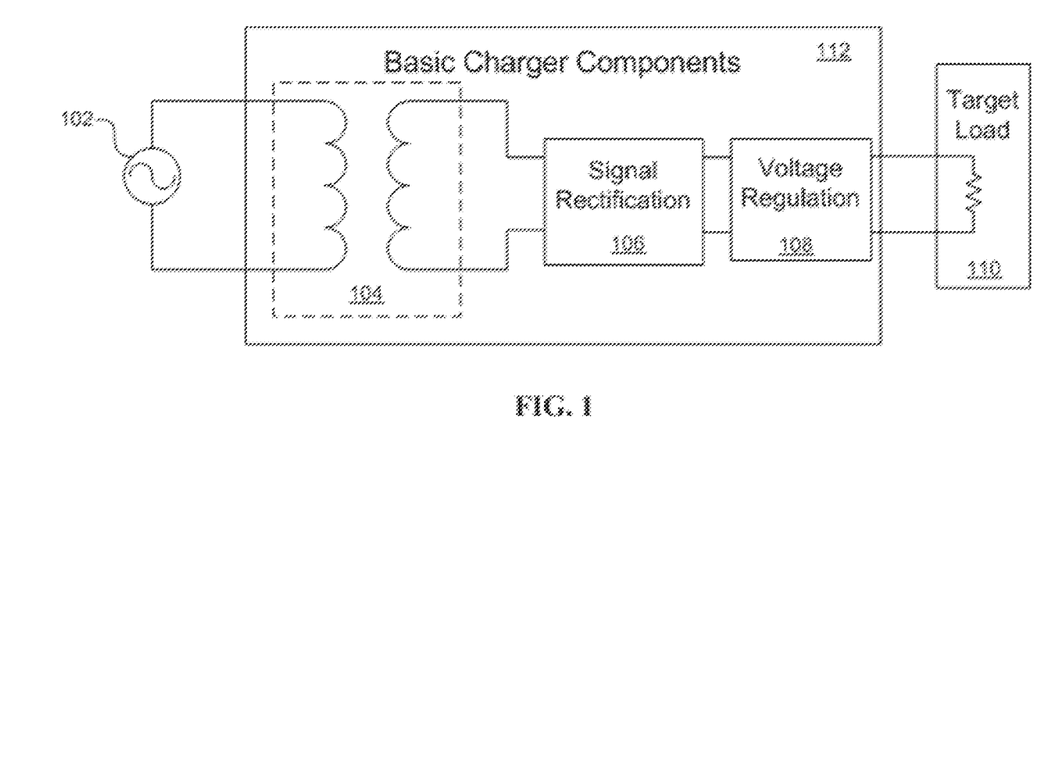
FIG. 1 shows the basic components of a typical wired battery charger how they exist today.

The basic DC power supply or battery charger plugs into a AC source via a wall receptacle and employs the use of a step-down transformer 104, signal rectification circuitry 106, and voltage regulation circuitry 108 as shown in FIG. 1. The transformer consists of two conductive independent coils that are mutually coupled by magnetic flux when current flows in one of them. The AC current flowing in the primary coil produces a changing magnetic field within the transformer core and there by induces an electric current in the secondary coil as described by Faraday's Law.

From transformer theory "no-load loss" is when energy loss occurs even when the secondary coil is left open or not attached to a load. According to academic literature the cause of no-load loss is attributed to eddy currents and magnetic hysteresis within the transformer core. In addition to no-load loss from the transformer, DC power supplies also incur dynamic and static power loss within the rectification and regulation circuitry. All of these combined losses within the DC power supply attribute to a significant portion of "vampire energy loss" which exists in many electronic product domains.

Techniques have been in place to reduce no-load loss within power conversion circuits; however the most effective way to stop no-load loss from the device charger is to take the DC power supply or battery charger completely off of the power grid.

PRIOR ART

With the design of the vampire labs' vampire proof charger invention titled "Limitation of vampiric power consumption with decoupling of an inductive power apparatus and an alternating current power source" U.S. patent application Ser. No. 12/497,859 (the '859 application) and related provisional patent application 61/078,365 (the '365 application) the charger control circuit works by sensing and detecting the charge state of the battery. Once the battery is charged the control circuit disconnects the charger from the power grid via a relay and thus different detection and decoupling mechanisms are used. The '859 and '365 applications involve a user behavior change such as pressing a push button switch to initiate a charge sequence.

The application titled "Automatic coupling of an alternating current power source and an inductive power apparatus to charge a target device battery" patent application Ser. No. 12/511,069 and related provisional application No. 61/084,616 uses electronic control mechanism on the target device to determine shutdown.

The application titled "Electromechanical Vampire Proof Charging system" patent application Ser. No. 12/709,502 and related provisional application No. 61/154,414 uses a physical or mechanical connection from signal ports from the charger to the target to initiate a charge session. Physical coupling is required to complete the circuit from the AC power source to the charger's power conversion circuit.

The application titled "Electromechanical Vampire Proof Charger" patent application Ser. No. 12/718,122 and related provisional application No. 61/157,565 uses physical contact from the target device to trigger an electromechanical switch to the circuit from the AC power source to the charger's power conversion circuit.

The application titled "Limitation of vampiric energy loss within wireless inductive battery charger" provisional patent application No. 61/589,388 also uses a reed switch to turn off the charger like the invention proposed in this invention. The difference in the invention proposed in this document is the use of the wired power transmission and hybrid connector plug.

FIELD OF INVENTION

This invention relates to energy efficient battery chargers, and technology that eliminates vampire energy loss using magnetic field proximity switches and hybrid connector plugs.

SUMMARY

Figure 2:
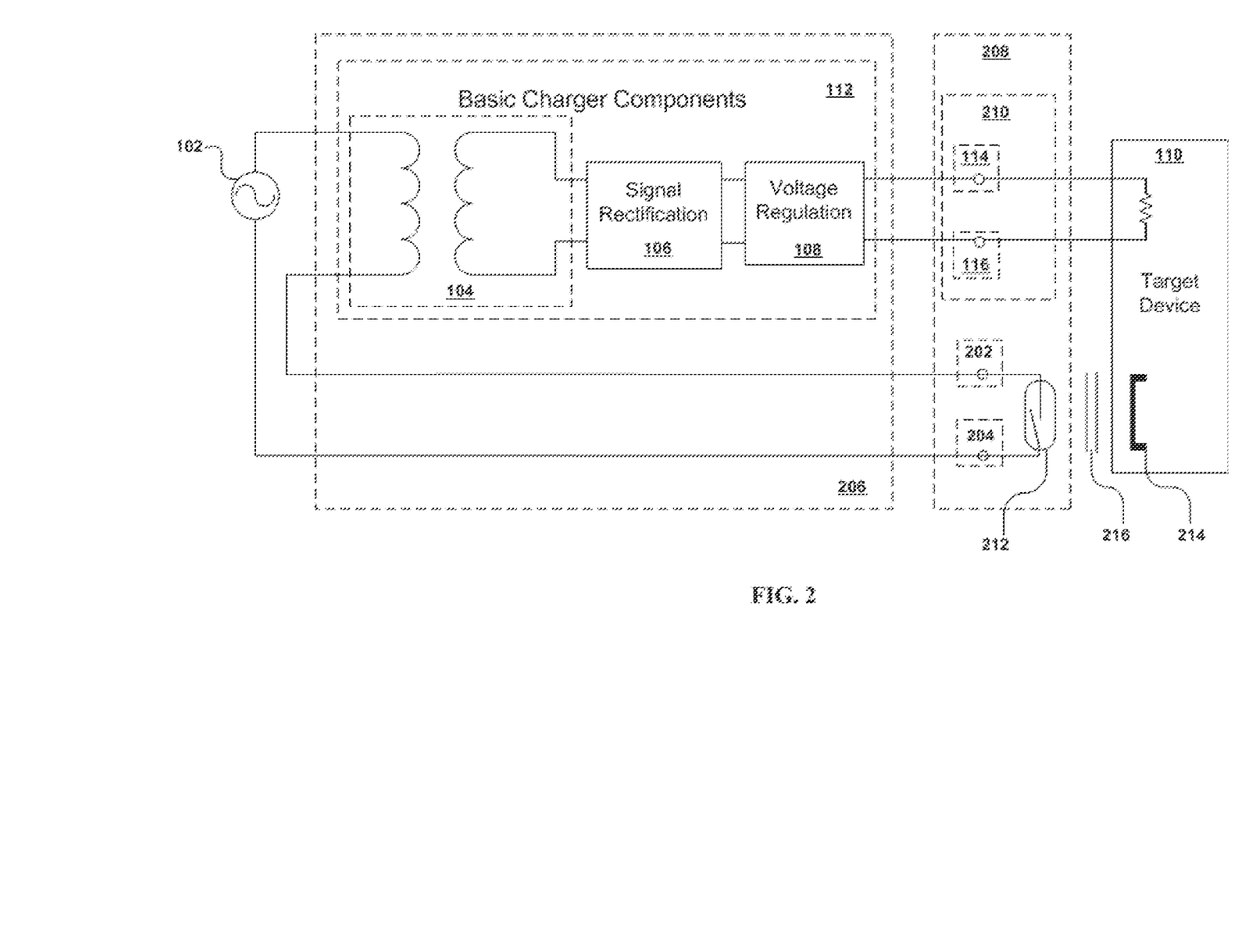
FIG. 2 shows a circuit augmentation of FIG. 1 with the add-on circuitry proposed in this disclosure, according to an embodiment.
Figures 3A, 3B:
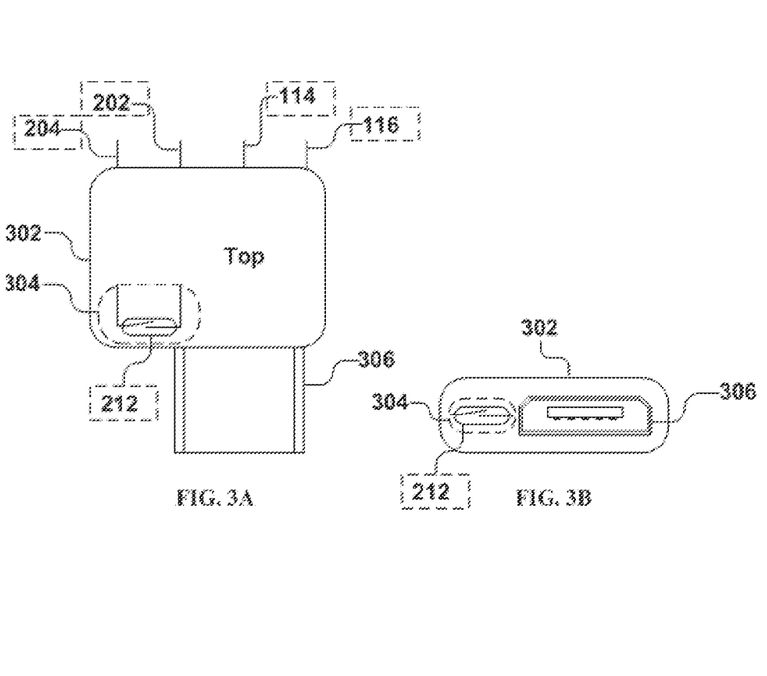
FIG. 3A to 3C Describes top, side and front view angles of one embodiment of the hybrid connector plug using a USB Micro-B connector as an example to deliver the DC power and ground signals. The diagram also depicts the internal placement of the reed switch inside the hybrid plug.
Figure 3C:
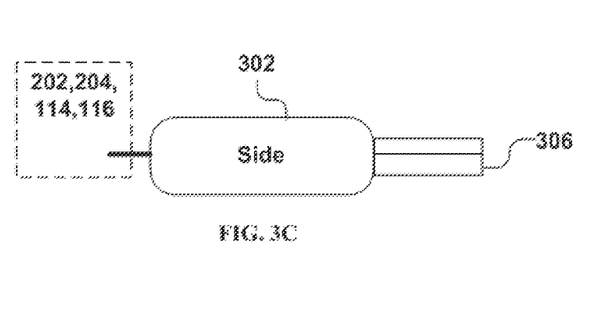
Figure 11:
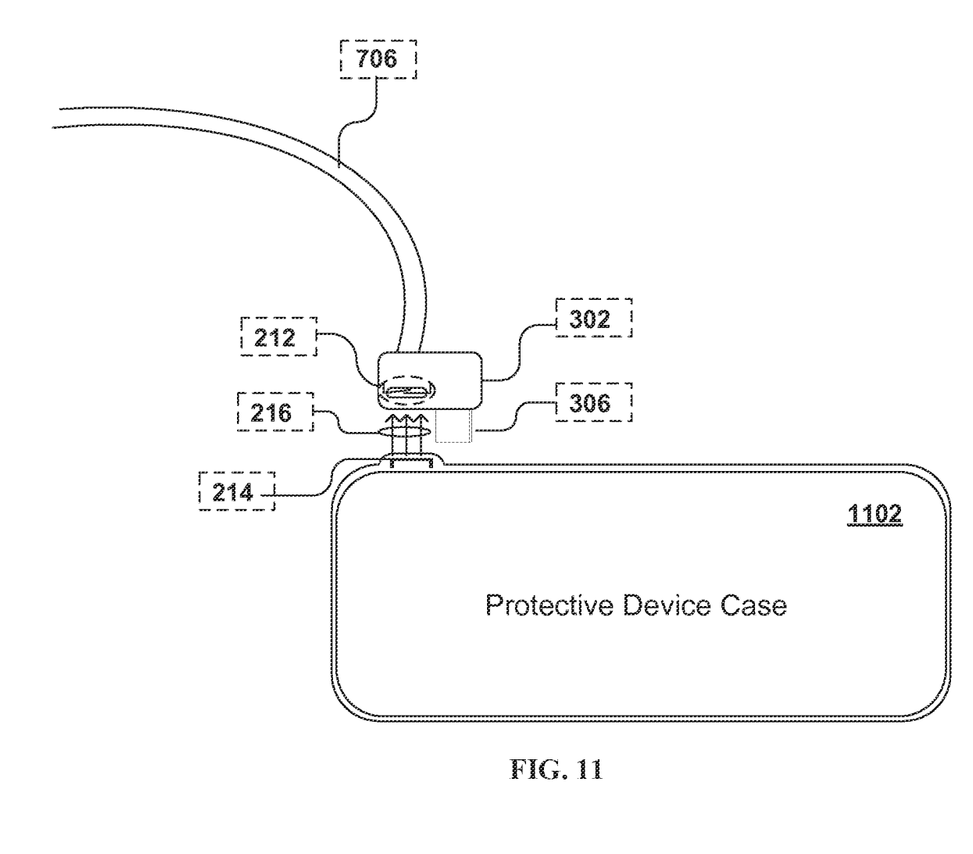
FIG. 11 illustrates a magnet mounted to a case enclosing the target device, according to an embodiment.

The vampire proof charger proposed in this invention disclosure is designed to eliminate VEL when a target device is not connected to the hybrid power plug described electrically in 208 and visually in 302. This hybrid plug may be configured with many different types of electrical connectors such as a barrel connector or USB-Micro-B as described in FIG. 3. This said invention employs the use of a reed switch or magnetic switch on the hybrid plug 302 and a small ferromagnetic component 214 embedded on the device or within a protective case 1102 as shown in FIG. 11. The reed switch 212 will electrically close when in the ambient presence of a correctly oriented magnetic field that is provided by the ferromagnetic component or permanent magnet 214 shown in FIG. 2.

The vampire proof control circuit proposed in this invention disclosure eliminates vampire energy loss in battery chargers and external power supplies when the target device 110 is not connected to the hybrid plug 302. This energy loss includes the "no load loss" of the step down transformer 104, static and dynamic power consumption of the rectification 106, regulation 108 circuitry as shown in FIG. 1.

Figure 7:
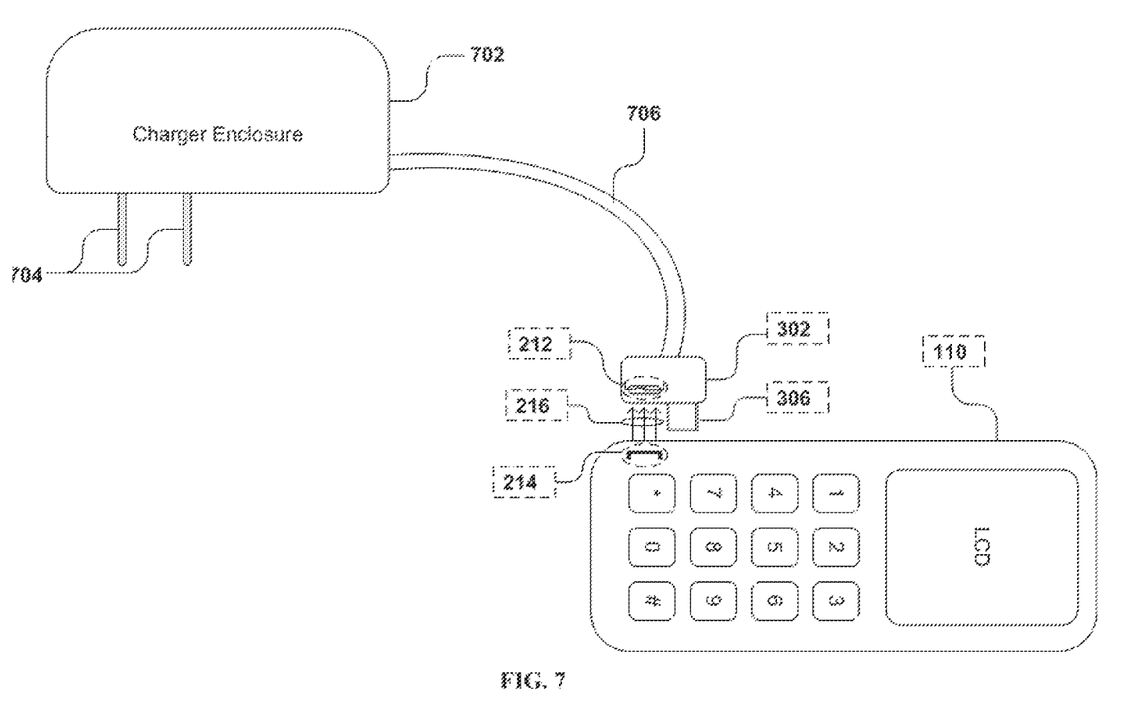
FIG. 7 shows how the hybrid plug could be added, and the augmented circuit could be integrated inside existing charger enclosures and target devices, according to an embodiment.
Figure 8:
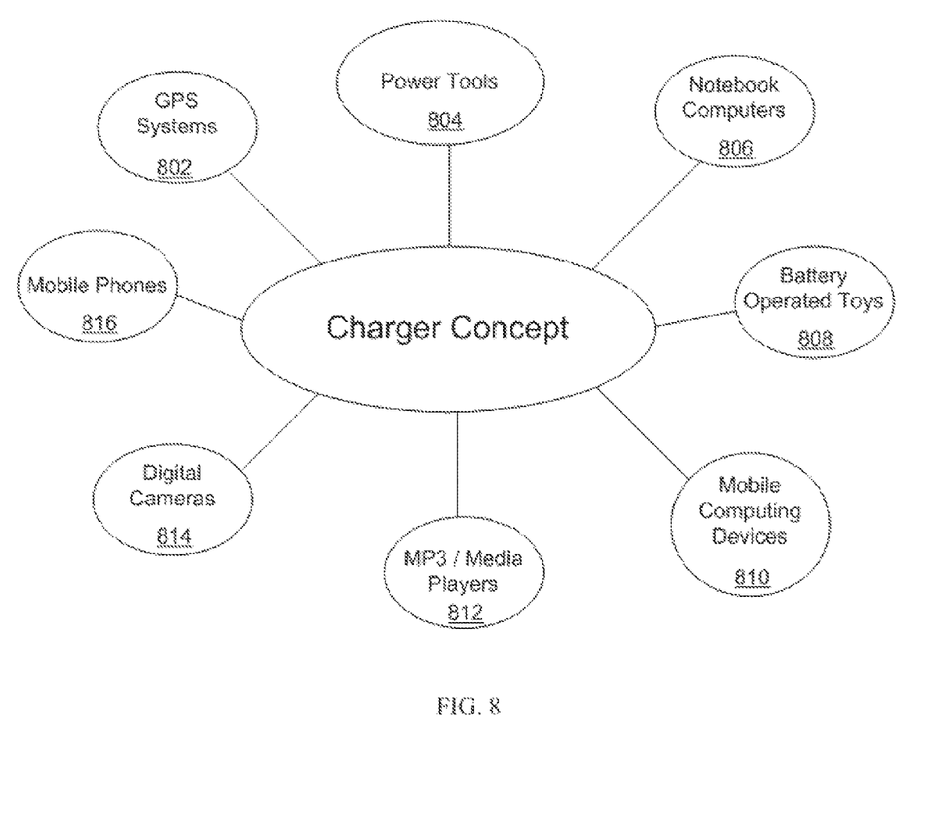
FIG. 8 illustrates how the invention concept could be expanded to other battery operated products, according to an embodiment.

The Vampire Proof circuitry proposed in this invention disclosure has been designed to be integrated as add on circuitry to existing charger circuits, enclosures, and target devices as illustrated by FIG. 7 which shows how the components can be realized within a enclosure. The concept of this invention can be extended to include many other battery operated products that require frequent battery charging including the additional products described in FIG. 8.

DETAILED DESCRIPTION

The vampire proof control circuit proposed in this invention disclosure employs the use of a reed switch 212 to complete the circuit from AC power 102 from a wall receptacle to the input of the AC to DC power conversion circuit 112. This invention also employs the use of a hybrid plug which encompasses the reed switch 212 to provide close spatial proximity to the magnet 214 on the target device 110. This invention also requires the existence of a magnetic field which could be provided by an internal or external permanent magnet on the target device 110 shown internally in FIG. 7 or generated by an electro-magnet by the target device which could be used for programmable control of the charge session by the target device. Using software on the target device to control an embedded electro-magnet in place of a permanent magnet 214 enables the possibility of the power management software on the target device 110 to control the on or off state of the charger. In this scenario a target device such as a cell phone or mobile computer could route electrical current through a coil to generate the magnetic field 216 shown schematically in FIG. 2 and conceptually in FIG. 7. This would enable the target device to be capable of turning off the charger when the battery is fully charged and then back on if it has drained. By using the permanent magnet 214 the charger will remain on until the user disconnects the charger from the hybrid plug. In either case the hybrid plug 302 is necessary for the reed switch to be in close proximity of the magnetic field 216 that is provided by the target device 110. In either scenario the reed switch will be used in the normally open configuration so that charger will be in the off state when the magnetic field is not present.

The proposed hybrid plug shown schematically in 208 and visually in 302 in this invention disclosure could be added to existing power conversion circuits like the one described in FIG. 1 by routing the AC current 102 from the wall receptacle to port 204 of the reed switch. When the "normally open" reed switch is electrically closed by the presence of the magnetic field which is provided by the target device 110, current from the AC power source 102 is allowed to flow in to the input of the AC to DC power conversion circuit 112 via port 202.

The spatial placement of the reed switch 212 and the electro-magnet or permanent magnet must be such that the magnetic field lines 216 point in a direction that initiates a change of state with the reed switch so that the "normally open" reed switch changes to the closed state when the magnet is in close proximity. It is desirable to have the reed switch 212 as close as possible to the source of the magnetic field 214 when the hybrid plug 302 is connected to the target device 110 so that the magnetic field strength is high enough to change the state of the reed switch.

Figure 4:
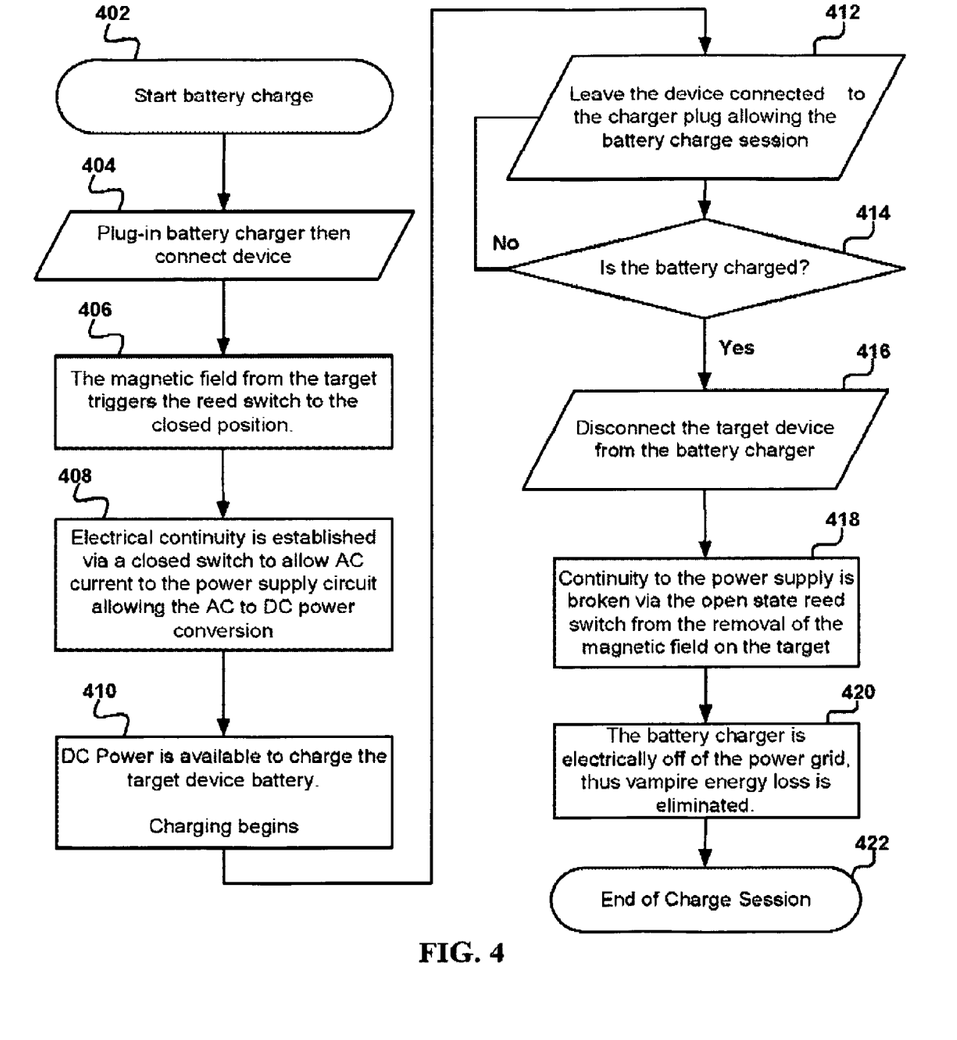
FIG. 4 shows a usage flow chart that illustrates temporal operation between the user and a realization of an embodiment using the permanent magnet configuration.

To initiate a charge session 402 with the permanent magnet configuration the charger must be connect to the AC power source 102 and the target device 110 as described in 404. The magnetic field from the permanent magnet triggers the reed switch 212 to the closed position, thus allowing current from the AC power source 102 to the input of the DC power conversion circuit 112 via switch ports 202 and 204 as described temporally in step 408. At this point DC power is available to the target device 110 via power and ground ports 114 and 116, thus battery charging begins as described in step 410. Battery charging will continue until the battery is fully charged in which case the user disconnects the target device from the hybrid connector plug 302 as described in 416. The power conversion circuit 112 will remain on the power grid until the user disconnects the target device from the hybrid plug 302 of the charger 702 regardless if the battery is charged or not.

Figure 5:
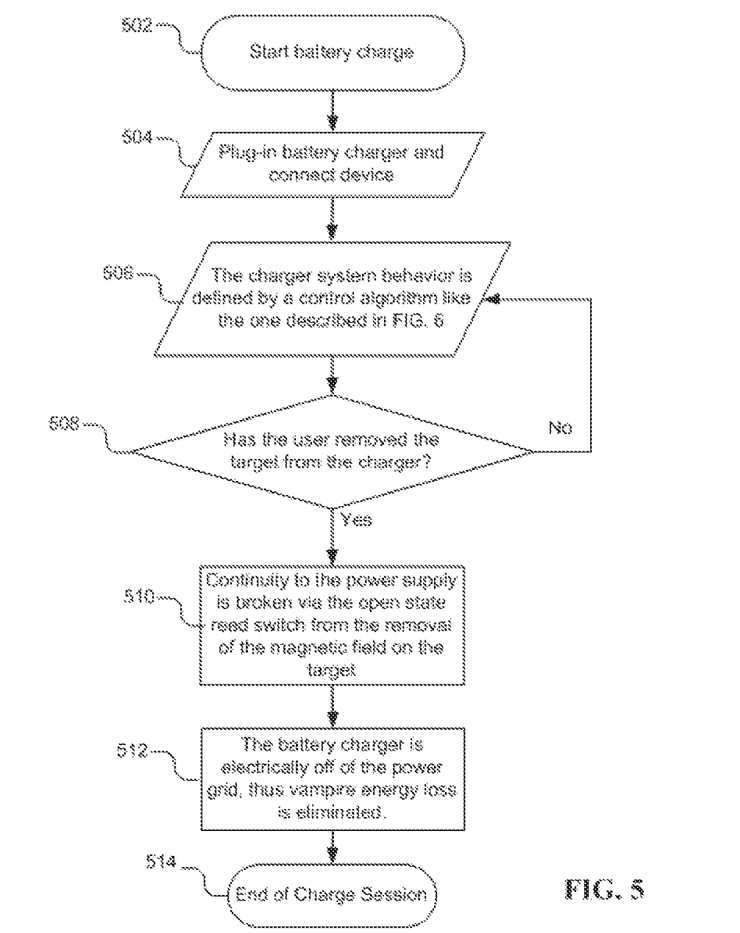
FIG. 5 shows a usage flow chart that illustrates temporal operation between the user and a realization of an embodiment using the electro-magnet configuration.
Figure 6:
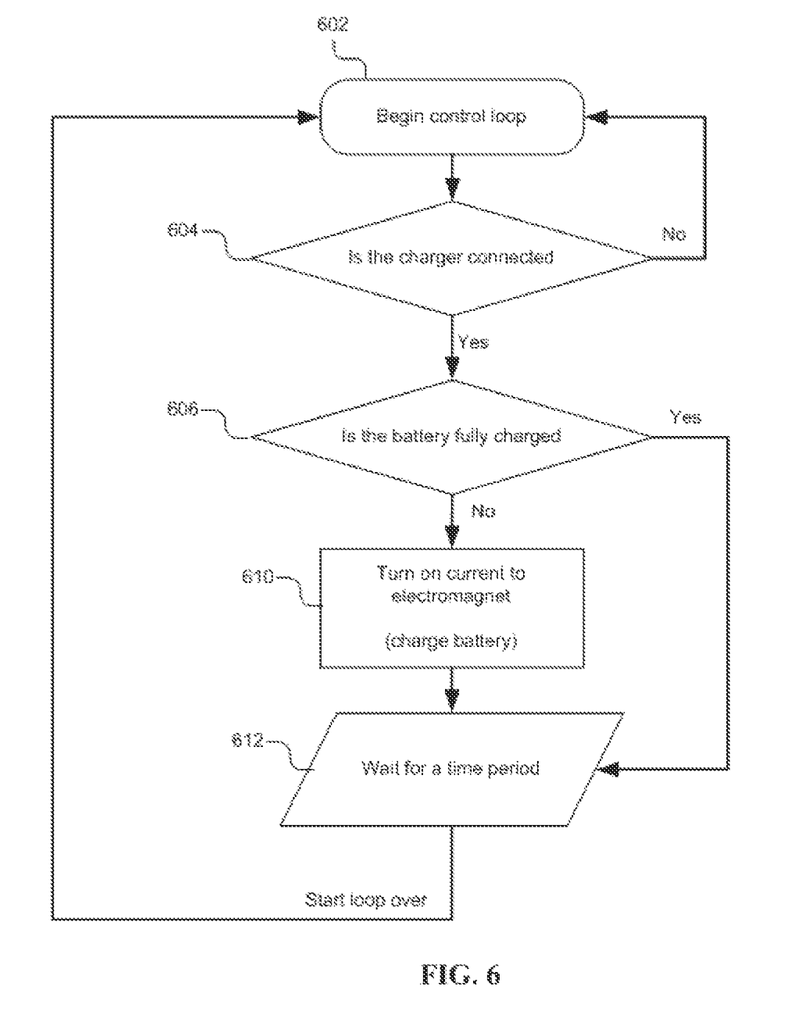
FIG. 6 shows a possible implementation of a charger control algorithm that could be executed by the target device to power the electro-magnet in order to control the charger, according to an embodiment.

To initiate a charge session 502 with the electro-magnet configuration the charger must be connect to the AC power source 102 and the target device 110 as described in 504. At this point a charger control algorithm like the one described in FIG. 6 takes control of the charge session until the user disconnects the target device 110 from the hybrid plug 302. The first step of the charger control algorithm described in FIG. 6 is the check to determine if the battery is connected to the charger plug 302 as shown in step 604. If the target device is connect to the charger the algorithm will check to see if the battery is fully charged as shown in 606. If the battery needs to be charged the control algorithm will allow current to the electromagnet 214 for duration of time. The magnetic field generated by the electromagnet will trigger the reed switch to the closed position and will allow current from the AC power source 102 to enter the power conversion circuit 112 of the battery charger in the same way as it would occur in the case of the permanent magnet. At this point DC power is available to the target device 110 via power and ground ports 114 and 116, thus battery charging begins as described in step 610. The control algorithm will continue this sequence of steps 602 through 612 until the battery is fully charged or the user disconnects the battery from the charger. If the battery is fully charged the algorithm will skip step 610 and enter the wait state before starting the loop over again. In the case of the user removing the target device 110 from the connector plug 302 the control algorithm will loop between steps 602 and 604 and the charge sequence will complete as described in steps 508 to 514. The control algorithm described in FIG. 6 may be expanded to accommodate other scenarios and potential control hazards.

Figure 9:
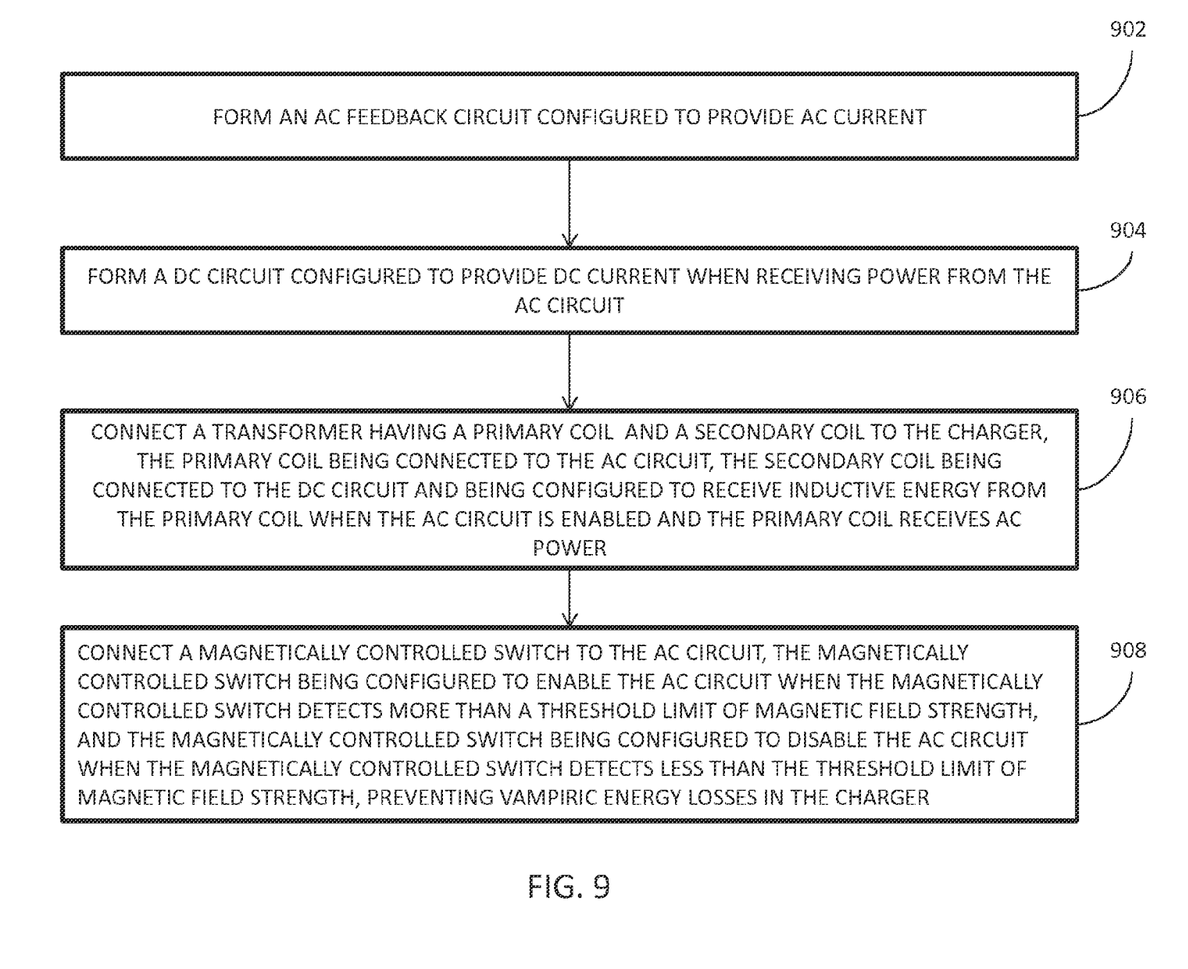
FIG. 9 is a process flow for assembling the charger, according to an embodiment.

FIG. 9 is a process flow for assembling the charger, according to an embodiment. In operation 902, an AC feedback circuit is formed that is configured to provide AC current. In operation 904, a DC circuit is formed that is configured to provide DC current when receiving power from the AC circuit. In operation 906, a transformer having a primary coil and a secondary coil is connected to the charger, the primary coil being connected to the AC circuit, the secondary coil being connected to the DC circuit and being configured to receive inductive energy from the primary coil when the AC circuit is enabled and the primary coil receives AC power. In operation 908, a magnetically controlled switch is connected to the AC circuit, the magnetically controlled switch being configured to enable the AC circuit when the magnetically controlled switch detects more than a threshold limit of magnetic field strength, and the magnetically controlled switch being configured to disable the AC circuit when the magnetically controlled switch detects less than the threshold limit of magnetic field strength, preventing vampiric energy losses in the charger.

Figure 10:
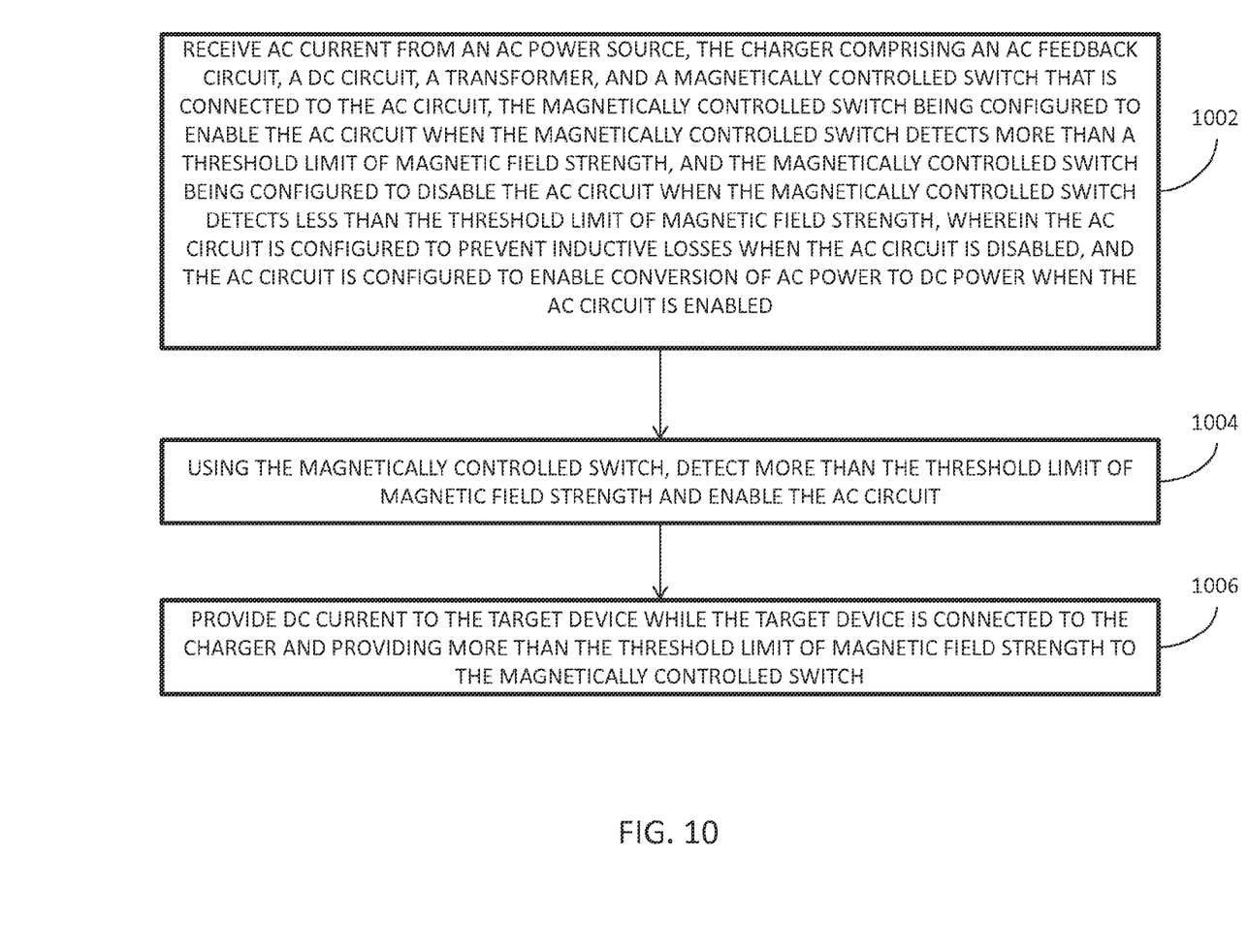
FIG. 10 is a process flow for operation of the charger, according to an embodiment.

FIG. 10 is a process flow for operation of the charger, according to an embodiment. In operation 1002, the charger system receives AC current from an AC power source, the charger comprising an AC feedback circuit, a DC circuit, a transformer, and a magnetically controlled switch that is connected to the AC circuit, the magnetically controlled switch being configured to enable the AC circuit when the magnetically controlled switch detects more than a threshold limit of magnetic field strength, and the magnetically controlled switch being configured to disable the AC circuit when the magnetically controlled switch detects less than the threshold limit of magnetic field strength, wherein the AC circuit is configured to prevent inductive losses when the AC circuit is disabled, and the AC circuit is configured to enable conversion of AC power to DC power when the AC circuit is enabled. In operation 1004, the charger system uses the magnetically controlled switch to detect more than the threshold limit of magnetic field strength and enable the AC circuit. In operation 1006, the charger system provides DC current to the target device while the target device is connected to the charger and providing more than the threshold limit of magnetic field strength to the magnetically controlled switch.

In an embodiment, the system includes a charger for recharging a target device when the charger is connected to a power source, the charger including an AC feedback circuit configured to provide AC current, and a DC circuit configured to provide DC current when receiving power from the AC circuit. The charger further includes a transformer having a primary coil and a secondary coil, the primary coil being connected to the AC circuit, the secondary coil being connected to the DC circuit and being configured to receive inductive energy from the primary coil when the AC circuit is enabled and the primary coil receives AC power. The charger also includes a magnetically controlled switch that is connected to the AC circuit, the magnetically controlled switch being configured to enable the AC circuit when the magnetically controlled switch detects more than a threshold limit of magnetic field strength, and the magnetically controlled switch being configured to disable the AC circuit when the magnetically controlled switch detects less than the threshold limit of magnetic field strength.

The AC circuit is configured to prevent inductive losses in the transformer between the primary coil and the secondary coil when the AC circuit is disabled, and the AC circuit is configured to enable conversion of AC power to DC power using the primary coil and the secondary coil of the transformer when the AC circuit is enabled.

The magnetically controlled switch may be disposed at a position to detect more than the threshold limit of magnetic field strength when the target device is connected to the charger, and to detect less than the threshold limit of magnetic field strength when the target device is disconnected from the charger. The magnetically controlled switch may include a reed switch.

The charger may further include a hybrid plug that includes a connector and the magnetically controlled switch, the connector being configured to connect to the target device and to deliver DC current to the target device. The connector may extend from a surface of the hybrid plug. The magnetically controlled switch may be disposed adjacent to the connector. The magnetically controlled switch may be disposed below the surface of the hybrid plug.

The target device may include a side formed with a receiving location configured to connect with the connector to receive DC current, and may further includes a magnet disposed at the side of the target device, the magnetically controlled switch being configured to receive the magnetic field from the magnet. The charger may further include a charger enclosure that encloses the transformer; and a cable connected to the charger enclosure and the hybrid plug, wherein the cable includes part of the AC circuit and part of the DC circuit.

In an embodiment, a method of forming a charger for recharging a target device when the charger is connected to a power source is provided. The method includes forming an AC feedback circuit configured to provide AC current, and forming a DC circuit configured to provide DC current when receiving power from the AC circuit. The method further includes connecting a transformer having a primary coil and a secondary coil to the charger, the primary coil being connected to the AC circuit, the secondary coil being connected to the DC circuit and being configured to receive inductive energy from the primary coil when the AC circuit is enabled and the primary coil receives AC power.

The method also includes connecting a magnetically controlled switch to the AC circuit, the magnetically controlled switch being configured to enable the AC circuit when the magnetically controlled switch detects more than a threshold limit of magnetic field strength, and the magnetically controlled switch being configured to disable the AC circuit when the magnetically controlled switch detects less than the threshold limit of magnetic field strength.

The AC circuit is configured to prevent vampiric energy losses in the transformer between the primary coil and the secondary coil when the AC circuit is disabled, and the AC circuit is configured to enable conversion of AC power to DC power using the primary coil and the secondary coil of the transformer when the AC circuit is enabled.

The magnetically controlled switch may be disposed at a position to detect more than the threshold limit of magnetic field strength when the target device is connected to the charger, and to detect less than the threshold limit of magnetic field strength when the target device is disconnected from the charger. The magnetically controlled switch may include a reed switch.

The method may further include a hybrid plug that includes a connector and the magnetically controlled switch, the connector being configured to connect to the target device and to deliver DC current to the target device. The connector may from a surface of the hybrid plug. The magnetically controlled switch may be disposed adjacent to the connector. The magnetically controlled switch may be disposed below the surface of the hybrid plug. The target device may include a side formed with a receiving location configured to connect with the connector to receive DC current, and further includes a magnet disposed at the side of the target device, the magnetically controlled switch being configured to receive the magnetic field from the magnet. The magnet may be mounted to a case enclosing the target device.

In an embodiment, a method of preventing vampiric power loss in a charger for recharging a target device is provided. The method includes receiving AC current from an AC power source, the charger comprising an AC feedback circuit configured to provide AC current, and a DC circuit configured to provide DC current when receiving power from the AC circuit. The charger further includes a transformer having a primary coil and a secondary coil, the primary coil being connected to the AC circuit, the secondary coil being connected to the DC circuit and being configured to receive inductive energy from the primary coil when the AC circuit is enabled and the primary coil receives AC power. The charger further includes a magnetically controlled switch that is connected to the AC circuit, the magnetically controlled switch being configured to enable the AC circuit when the magnetically controlled switch detects more than a threshold limit of magnetic field strength, and the magnetically controlled switch being configured to disable the AC circuit when the magnetically controlled switch detects less than the threshold limit of magnetic field strength.

The AC circuit is configured to prevent inductive losses in the transformer between the primary coil and the secondary coil when the AC circuit is disabled, and the AC circuit is configured to enable conversion of AC power to DC power using the primary coil and the secondary coil of the transformer when the AC circuit is enabled.

The method includes using the magnetically controlled switch to detect more than the threshold limit of magnetic field strength and enabling the AC circuit, and providing DC current to the target device while the target device is connected to the charger and providing more than the threshold limit of magnetic field strength to the magnetically controlled switch.

The method may further include using the magnetically controlled switch to detect less than the threshold limit of magnetic field strength. The method may further include using the magnetically controlled switch to disable the AC circuit and prevent vampiric energy losses in the transformer of the charger. The magnetically controlled switch may detect less than the threshold limit of magnetic field strength when the target device is disconnected from the charger.

Although the invention has been described using specific terms, devices, and/or methods, such description is for illustrative purposes of the preferred embodiment(s) only. Changes may be made to the preferred embodiment(s) by those of ordinary skill in the art without departing from the scope of the present invention, which is set forth in the following claims. In addition, it should be understood that aspects of the preferred embodiment(s) generally may be interchanged in whole or in part.

What is claimed is:

1. A charger for recharging a target device when the charger is connected to a power source, the charger comprising:
    an AC feedback circuit configured to provide AC current;
    a DC circuit configured to provide DC current when receiving power from the AC circuit;
    a transformer having a primary coil and a secondary coil, the primary coil being connected to the AC circuit, the secondary coil being connected to the DC circuit and being configured to receive inductive energy from the primary coil when the AC circuit is enabled and the primary coil receives AC power; and
    a magnetically controlled switch that is connected to the AC circuit, the magnetically controlled switch being configured to enable the AC circuit when the magnetically controlled switch detects more than a threshold limit of magnetic field strength, and the magnetically controlled switch being configured to disable the AC circuit when the magnetically controlled switch detects less than the threshold limit of magnetic field strength,
    wherein the AC circuit is configured to prevent inductive losses in the transformer between the primary coil and the secondary coil when the AC circuit is disabled, and the AC circuit is configured to enable conversion of AC power to DC power using the primary coil and the secondary coil of the transformer when the AC circuit is enabled.

2. The charger of claim 1, wherein the magnetically controlled switch is disposed at a position to detect more than the threshold limit of magnetic field strength when the target device is connected to the charger, and to detect less than the threshold limit of magnetic field strength when the target device is disconnected from the charger.

3. The charger of claim 1, wherein the magnetically controlled switch includes a reed switch.

4. The charger of claim 1, further comprising a hybrid plug that includes a connector and the magnetically controlled switch, the connector being configured to connect to the target device and to deliver DC current to the target device.

5. The charger of claim 4, wherein the connector extends from a surface of the hybrid plug.

6. The charger of claim 5, wherein the magnetically controlled switch is disposed adjacent to the connector.

7. The charger of claim 6, wherein the magnetically controlled switch is disposed below the surface of the hybrid plug.

8. The charger of claim 4, wherein the target device includes a side formed with a receiving location configured to connect with the connector to receive DC current, and further includes a magnet disposed at the side of the target device, the magnetically controlled switch being configured to receive the magnetic field from the magnet.

9. The charger of claim 8, wherein the magnet is mounted to a case enclosing the target device.

10. The charger of claim 4, further comprising
    a charger enclosure that encloses the transformer; and
    a cable connected to the charger enclosure and the hybrid plug, wherein the cable includes part of the AC circuit and part of the DC circuit.

11. A method of forming a charger for recharging a target device when the charger is connected to a power source, the method comprising:
    forming an AC feedback circuit configured to provide AC current;
    forming a DC circuit configured to provide DC current when receiving power from the AC circuit;
    connecting a transformer having a primary coil and a secondary coil to the charger, the primary coil being connected to the AC circuit, the secondary coil being connected to the DC circuit and being configured to receive inductive energy from the primary coil when the AC circuit is enabled and the primary coil receives AC power; and
    connecting a magnetically controlled switch to the AC circuit, the magnetically controlled switch being configured to enable the AC circuit when the magnetically controlled switch detects more than a threshold limit of magnetic field strength, and the magnetically controlled switch being configured to disable the AC circuit when the magnetically controlled switch detects less than the threshold limit of magnetic field strength,
    wherein the AC circuit is configured to prevent vampiric energy losses in the transformer between the primary coil and the secondary coil when the AC circuit is disabled, and the AC circuit is configured to enable conversion of AC power to DC power using the primary coil and the secondary coil of the transformer when the AC circuit is enabled.

12. The method of claim 11, wherein the magnetically controlled switch is disposed at a position to detect more than the threshold limit of magnetic field strength when the target device is connected to the charger, and to detect less than the threshold limit of magnetic field strength when the target device is disconnected from the charger.

13. The method of claim 11, wherein the magnetically controlled switch includes a reed switch.

14. The method of claim 11, further comprising a hybrid plug that includes a connector and the magnetically controlled switch, the connector being configured to connect to the target device and to deliver DC current to the target device.

15. The method of claim 14, wherein the connector extends from a surface of the hybrid plug.

16. The method of claim 15, wherein the magnetically controlled switch is disposed adjacent to the connector.

17. The method of claim 16, wherein the magnetically controlled switch is disposed below the surface of the hybrid plug.

18. The method of claim 14, wherein the target device includes a side formed with a receiving location configured to connect with the connector to receive DC current, and further includes a magnet disposed at the side of the target device, the magnetically controlled switch being configured to receive the magnetic field from the magnet.

19. A method of preventing vampiric power loss in a charger for recharging a target device, the method comprising:
   receiving AC current from an AC power source, the charger comprising
      an AC feedback circuit configured to provide AC current;
      a DC circuit configured to provide DC current when receiving power from the AC circuit;
      a transformer having a primary coil and a secondary coil, the primary coil being connected to the AC circuit, the secondary coil being connected to the DC circuit and being configured to receive inductive energy from the primary coil when the AC circuit is enabled and the primary coil receives AC power, and
      a magnetically controlled switch that is connected to the AC circuit, the magnetically controlled switch being configured to enable the AC circuit when the magnetically controlled switch detects more than a threshold limit of magnetic field strength, and the magnetically controlled switch being configured to disable the AC circuit when the magnetically controlled switch detects less than the threshold limit of magnetic field strength,
   wherein the AC circuit is configured to prevent inductive losses in the transformer between the primary coil and the secondary coil when the AC circuit is disabled, and the AC circuit is configured to enable conversion of AC power to DC power using the primary coil and the secondary coil of the transformer when the AC circuit is enabled;
   using the magnetically controlled switch, detecting more than the threshold limit of magnetic field strength and enabling the AC circuit; and
   providing DC current to the target device while the target device is connected to the charger and providing more than the threshold limit of magnetic field strength to the magnetically controlled switch.

20. The method of claim 18, further comprising:
   using the magnetically controlled switch, detecting less than the threshold limit of magnetic field strength;
   using the magnetically controlled switch, disabling the AC circuit and preventing vampiric energy losses in the transformer of the charger.

\* \* \* \* \*